(12) United States Patent
Langer et al.

(10) Patent No.: US 10,283,680 B2
(45) Date of Patent: May 7, 2019

(54) METHOD FOR THE PRODUCTION OF AN ELECTRONIC MODULE HAVING AN ELECTRONIC COMPONENT EMBEDDED THEREIN

(71) Applicant: AT&S Austria Technologie & Systemtechnik Aktiengesellschaft, Leoben (AT)

(72) Inventors: Gregor Langer, Wölfnitz (AT); Johannes Stahr, St. Lorenzen (AT)

(73) Assignee: AT&S Austria Technologie & Systemtechnik Aktiengesellschaft, Leoben (AT)

(*) Notice: Subject to any disclaimer, the term of this patent is extended or adjusted under 35 U.S.C. 154(b) by 0 days.

(21) Appl. No.: 15/147,673

(22) Filed: May 5, 2016

(65) Prior Publication Data

US 2016/0329469 A1    Nov. 10, 2016

(30) Foreign Application Priority Data

May 8, 2015   (EP) .................................... 15166915

(51) Int. Cl.
*H01L 33/48*    (2010.01)
*H01L 33/00*    (2010.01)
(Continued)

(52) U.S. Cl.
CPC ........ *H01L 33/486* (2013.01); *H01L 33/0095* (2013.01); *H01L 33/62* (2013.01);
(Continued)

(58) Field of Classification Search
CPC ....... H01L 33/486; H01L 33/00; H01L 33/56; H01L 23/142; H01L 23/49575; H01L 33/62; H01L 33/647
See application file for complete search history.

(56) References Cited

U.S. PATENT DOCUMENTS

2008/0318055 A1   12/2008   Fillion et al.
2010/0236821 A1    9/2010   Park et al.
(Continued)

FOREIGN PATENT DOCUMENTS

EP    2858131 A2    4/2015
EP    3091822 A1   11/2016
WO   2010048653 A2    5/2010

OTHER PUBLICATIONS

European Search Report for European Application No. 15166915.7, Search completed Sep. 18, 2015, dated Sep. 29, 2015, 7 Pgs.

*Primary Examiner* — Michael Lebentritt
*Assistant Examiner* — Suberr L Chi
(74) *Attorney, Agent, or Firm* — KPPB LLP

(57) ABSTRACT

An electronic module and method for the production of the electronic module in accordance with some embodiments of the invention are disclosed. The electronic module includes at least one electronic component affixed to a conductive layer by means of sticky electrically insulating layer, where the electronic component is embedded in a transparent foil. The electronic module is produces by providing an electrically conductive layer. At least one electronic component is affixed to the electrically conductive layer by means of a sticky electrically insulating layer and embedded in a transparent foil. The at least one electronic component is electronically contacted with the conductive layer.

15 Claims, 4 Drawing Sheets

(51) Int. Cl.
  *H05K 1/18*   (2006.01)
  *H01L 33/62*  (2010.01)
  *H05K 3/28*   (2006.01)
  *H05K 3/30*   (2006.01)
  *H01L 33/56*  (2010.01)
  *H01L 33/60*  (2010.01)

(52) U.S. Cl.
  CPC .............. *H05K 1/188* (2013.01); *H01L 33/56* (2013.01); *H01L 33/60* (2013.01); *H01L 2224/18* (2013.01); *H01L 2933/0033* (2013.01); *H01L 2933/0058* (2013.01); *H01L 2933/0066* (2013.01); *H05K 3/284* (2013.01); *H05K 3/305* (2013.01); *H05K 2201/0108* (2013.01); *H05K 2201/10106* (2013.01)

(56) References Cited

U.S. PATENT DOCUMENTS

| | | | |
|---|---|---|---|
| 2010/0328913 A1 | 12/2010 | Kugler et al. | |
| 2011/0203107 A1* | 8/2011 | Schrittwieser | H01L 21/6835 29/841 |
| 2011/0309404 A1* | 12/2011 | Lee | H01L 33/486 257/99 |
| 2012/0018759 A1* | 1/2012 | Ohta | H01L 33/60 257/98 |
| 2013/0001614 A1* | 1/2013 | Lo | H01L 33/42 257/98 |
| 2014/0061684 A1* | 3/2014 | Marutani | H01L 33/62 257/88 |
| 2014/0264417 A1 | 9/2014 | Kobayashi et al. | |
| 2015/0364661 A1* | 12/2015 | Sawada | H01L 33/54 257/98 |

\* cited by examiner

METHOD FOR THE PRODUCTION OF AN ELECTRONIC MODULE HAVING AN ELECTRONIC COMPONENT EMBEDDED THEREIN

CROSS-REFERENCE TO RELATED APPLICATION

The present invention claims priority to European Application No. 15166915.7, filed May 8, 2015, the disclosure of which is incorporated by reference herein its entirety.

FIELD OF THE INVENTION

The present invention relates to a method for the production of an electronic module as well as the corresponding electronic module.

BACKGROUND

It is an object of the present invention to provide a new type of electronic module which can be used as a display, a lighting installation or a camera.

SUMMARY OF THE INVENTION

To achieve this object the inventive method is characterized by the following steps:
a) providing an electrically conductive layer
b) affixing at least one electronic component on the electrically conductive layer by means of a sticky electrically insulating layer
c) embedding the at least one electronic component in a transparent foil
d) electrically contacting the at least one electronic component with the conductive layer.

In the following, the invention will be described mostly with reference to light-emitting components for the sake of simplicity. It is, however, intended to encompass a large number of electronic components. The terms "light-emitting component" and "electronic component" will be used interchangeably within this description. The electronic components to be used in the context of the present invention will be mentioned below.

By the inventive steps for the production of an electronic module it is possible to provide a large number of electronic components, in particular light-emitting components on an electrically conductive layer which light-emitting components when properly contacted by the electrically conductive layer can be controlled to emit light in any desired manner so that the electronic module can serve as a cheap but effective lighting installation or display for displaying any kind of image or information. Also, it can receive information by light. The use of sticky electrically insulating layer for affixing an electronic component on the electrically conductive layer avoids short-cutting of the electronic component by the underlying electrically conductive layer and embedding the component in a transparent foil protects the electronic component from chemical and mechanical influences. While the present description is given with reference to a single light-emitting component, it is clear to a person skilled in the art that a large number of light-emitting components will be arranged on an electrically conductive layer to form an electronic module with the capability to serve as a lighting installation, display, camera or the like.

Preferably, the electronic component is chosen from the group comprised of a light-emitting diode (LED), a laser-diode, a photo-diode and a photographic sensor. All these electronic components profit from being embedded in the transparent foil.

According to a preferred embodiment, the light-emitting component is a LED-flip-chip-component. A LED-flip-chip-component is particularly suitable to be used in the inventive method since LED technology allows for bright, distinct light points serving as pixels on a display or lighting installation at a very low cost. Flip-chip-components are electronic components having contact pads on the opposite side of the light-emitting side of the component so that when such a component is affixed on the electrically conductive layer by means of an electrically insulating layer of glue the contact pads of the component are oriented towards the electrically conductive layer and can in a later process stage easily be contacted with the electrically conductive layer.

As already mentioned, it is desirable within the context of the present invention to arrange a large number of light-emitting components on the electrically conductive layer and in particular it is advantageous to bring those components close to one another in order to provide for continuous lighting or a high resolution in case the electronic module serves as a display for displaying images or other information. To this end the invention preferably is characterized in that the step of contacting the light-emitting component comprises a step of laser-drilling the conductive layer and the sticky electrically insulating layer, since laser-drilling is a method that allows for high precision drilling of very small holes which subsequently can be filled for example with copper by copper plating procedures well known in the art of the production of printed circuit boards.

In order to further increase light emission from the electronic module, the inventive method preferably is characterized in that prior to the step of affixing the light-emitting component on the electrically conductive layer, a light-reflecting layer is applied to the electrically conductive layer. That means that light that is reflected to the electrically conductive layer for example by reflection on the boundary layer of the transparent foil will be reflected back again, so that the overall yield of light is increased which is particularly useful for lighting installations.

According to a preferred embodiment, the inventive method is characterized in that the light-reflecting layer is formed by a material chosen from the group consisting of solder resist and ceramic paste. It is important that the solder resist will not change color even when exposed to the light of the light-emitting components over a very long period of time. The use of ceramic paste in this context is particularly advantageous, since ceramic paste will not change color over time.

Another possibility that is contemplated according to a preferred embodiment of the present invention is characterized in that the light-reflecting layer is formed by a layer chosen from the group consisting of a metal layer and an oxide layer.

For the purposes of the present invention it is preferred that the transparent foil is an ethylene-vinyl acetate-foil. Ethylene-vinyl acetate (EVA) is highly transparent and flexible and thus allows for the flexible and transparent embedding of the light-emitting components, so that overall a flexible product is obtained which can be mounted also on curved surfaces.

A preferred embodiment of the present invention is characterized in that embedding the component comprises laminating the transparent foil by means of a vacuum-lamination method at a suction pressure of 1 bar to 5 bar at a temperature of 130° C. Under these conditions the transparent foil will readily adhere to the electrically conductive layer snuggly surrounding the components thereby embedding them and protecting them from mechanical or chemical damage.

In order to protect the transparent foil during the various process steps and in particular during the step of contacting the light-emitting component with a conductive layer which as stated above normally entails copper plating and also etching procedures, the method according to the present invention preferably is characterized in that the transparent foil is covered with a protective layer chosen from the group consisting of a plastic foil, a protective lacquer and a metal foil. A plastic foil, a protective lacquer and a metal foil can be removed after possibly damaging process steps leaving the transparent foil completely unharmed.

According to an alternative embodiment of the present invention the transparent foil is covered with a protective layer in form of a glass-plate. The glass-plate serves for the same purpose as the above plastic foils, protective lacquers and metal foils. However, the glass-plate may stay in place even on the final product protecting the transparent foil during the whole life time of the electronic module. In this context it is also conceivable that the glass-plate is thin enough to not impair the flexibility of the electronic module of the present invention. For example, the glass-plate preferably has a thickness of 50 µm. (µm=micrometer).

When the protective layer is structured for engraving relief-like surface-structures into the transparent foil, as it is in conformity with a preferred embodiment of the present invention, optical structures such as lenses and the like can be formed on the outer surface of the transparent foil. In this case the protective layer will, of course, have to be removed to yield the final product.

In principle the protective layer can be applied to the transparent foil in a separate production step. According to a preferred embodiment it is, however, envisaged that the protective layer is applied together with the transparent foil.

Alternative or additionally the transparent foil is chemically roughened turning the transparent foil into a turbid display for lighting installation purposes.

Preferably, the sticky electrically insulating layer is chosen from the group comprised of a layer of glue and a sticky tape.

The inventive electronic module comprises at least one electronic component affixed to a conductive layer by means of sticky electrically insulating layer, the light-emitting component being embedded in a transparent foil. Thus a large number of light-emitting components can be provided on an electrically conductive layer which light-emitting components when properly contacted by the electrically conductive layer can be controlled to emit light in any desired manner so that the electronic module can serve as a cheap but effective lighting installation, display, camera or the like for displaying or receiving any kind of image or information. The use of sticky electrically insulating layer for affixing an electronic component on the electrically conductive layer avoids short-cutting of the electronic component or light-emitting component by the underlying electrically conductive layer and embedding the component in a transparent foil protects the light-emitting component from chemical and mechanical influences. While the present description is given with reference to a single electronic component, it is clear to a person skilled in the art that a large number of light-emitting components will be arranged on an electrically conductive layer to form an inventive electronic module with the capability to serve as a lighting installation, display, camera or the like.

Preferably, the electronic component is chosen from the group comprised of a light-emitting diode (LED), a laser-diode, a photo-diode and a photographic sensor. All these electronic components profit from being embedded in the transparent foil.

A preferred embodiment of the present invention is characterized in that the light-emitting component is a LED-flipchip-component. A LED-flipchip-component is particularly suitable to be used in the inventive electronic module since LED technology allows for bright, distinct light points serving as pixels on a display or lighting installation at a very low cost. Flip-chip-components are electronic components having contact pads on the opposite side of the light-emitting side of the component so that when such a component is affixed on the electrically conductive layer by means of an electrically insulating layer of glue the contact pads of the component are oriented towards the electrically conductive layer and can easily be contacted with the electrically conductive layer.

According to a preferred embodiment the inventive electronic module is characterized in that the light-reflecting layer is formed by a material chosen from the group consisting of solder resist and ceramic paste. It is important that the solder resist will not change color even when exposed to the light of the light-emitting components over a very long period of time. The use of ceramic paste in this context is particularly advantageous, since ceramic paste will not change color over time.

Another possibility that is contemplated according to a preferred embodiment of the present invention is characterized in that the light-reflecting layer is formed by a layer chosen from the group consisting of a metal layer and an oxide layer.

For the purposes of the present invention it is preferred that the transparent foil is an ethylene-vinyl acetate-foil. Ethylene-vinyl acetate (EVA) is highly transparent and flexible and thus allows for the flexible and transparent embedding of the light-emitting components, so that overall a flexible product is obtained which can be mounted also on curved surfaces.

According to an alternative embodiment of the present invention the transparent foil is covered with a protective layer in form of a glass-plate. The glass-plate may stay in place even on the final product protecting the transparent foil during the whole life time of the electronic module. In this context it is also conceivable that the glass-plate is thin enough to not impair the flexibility of the electronic module of the present invention. For example, the glass-plate preferably has a thickness of 50 µm.

When the transparent foil is structured to relief-like surface-structures, as it is in conformity with a preferred embodiment of the present invention, optical structures such as lenses and the like can be formed on the outer surface of the transparent foil.

BRIEF DESCRIPTION OF THE DRAWINGS

The invention will now be described with reference to the accompanying drawings in which FIGS. 1a)-1e) show inventive process steps to produce the inventive electronic module

DETAILED DESCRIPTION

Figure 1A:
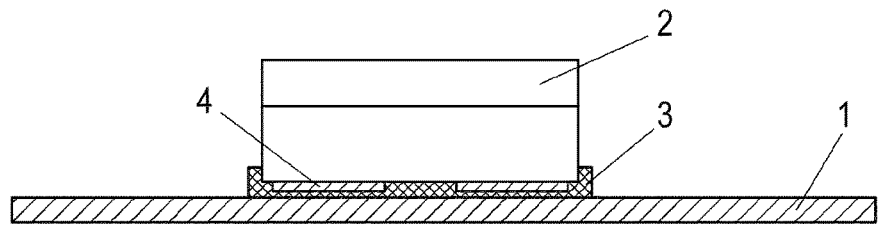
Figure 1B:
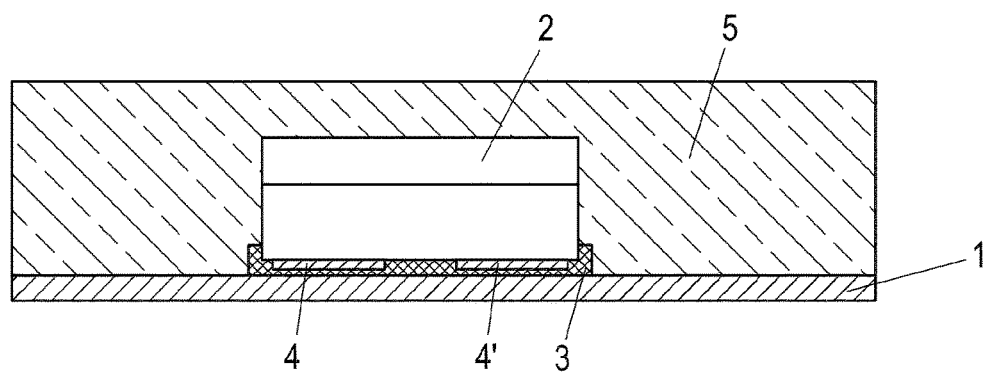
Figure 1C:
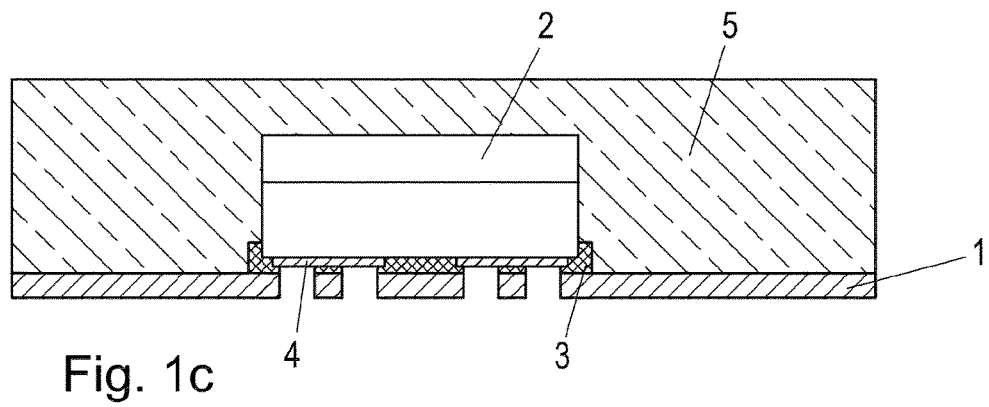
Figure 1D:
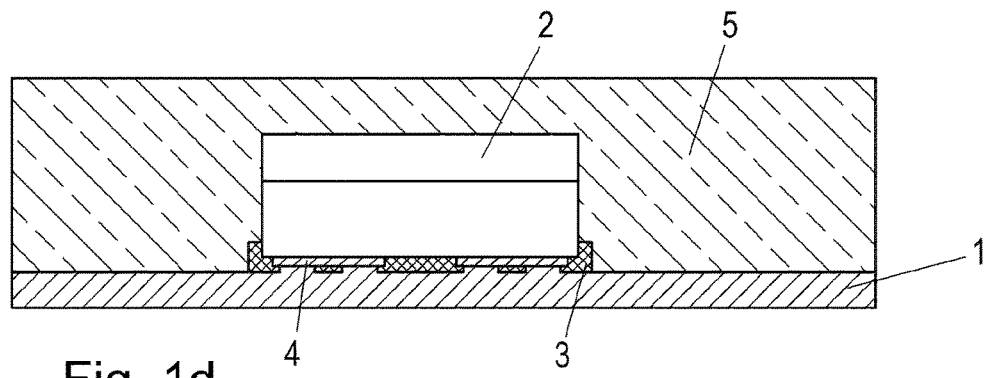
Figure 1E:
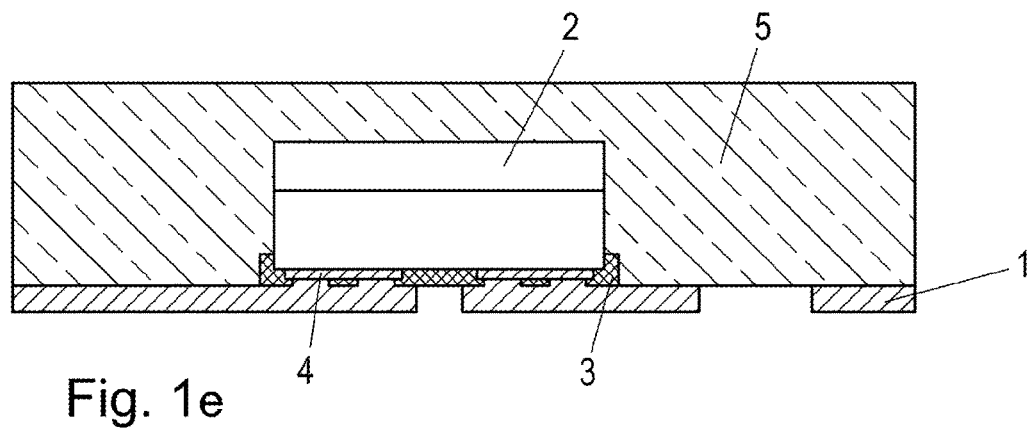

In FIG. 1a), the conductive layer is denoted by reference numeral 1. the electronic component, in this case a LED-chip is denoted by reference numeral 2 and is affixed to the conductive layer 1 by means of a sticky electrically insulating layer 3 of glue completely electrically insulating the contact pads 4 of the light-emitting component 2 from the conductive layer 1. In the next process step depicted in FIG. 1b), the light-emitting component 2 is embedded in a transparent foil 5 for example by vacuum-lamination at a suction pressure of 1 bar to 5 bar at a temperature of 150° C. for about 30 minutes. This ensures that the transparent foil 5 completely surrounds the light-emitting component 2 and fills all possible gaps and corners between the light-emitting component 2 and the conductive layer 1 so that the light-emitting component is snuggly embedded within the transparent foil 5. Next, the so far continuous conductive layer 1 is subjected to a laser-drilling procedure to drill holes to expose the contact pads 4 of the light-emitting component 2. The contact pads 4 of the light-emitting component 2, are arranged on the opposite side of the light-emitting side of the component. This arrangement is known to the person skilled in the art as a flip-chip configuration. The laser-drilling procedure is adapted to also remove the electrically insulating layer of glue 3 in the area of the contact pads 4 (FIG. 1c)). In FIG. 1d) a step of copper-plating is depicted which serves to fill the holes drilled in the previous step with copper thereby electrically connecting the contact pads 4 of the light-emitting component 2 to the conductive layer 1. In the next step, shown in FIG. 1e), the conductive layer 1 is suitably structured, for example by photolithography to turn the continuous conductive layer 1 into a conductive layer 1 of conductive paths, wiring the light-emitting component 2, to a power source and making to controllable by a microcomputer which can be arranged on the conductive layer 1 or which can be a self-contained module connected to the electronic module of the present invention by a suitable connector. For the sake of simplicity this is not shown in the drawings. While the present invention is claimed and described with regard to a single light-emitting component 1 it should be noted that the inventive process can be carried out with a large number of light-emitting components 2 arranged on the conductive layer 1 and that a large number of light-emitting components 2 can be embedded in the transparent foil 5 for example with the above described vacuum-lamination procedure at a time.

Figure 2:
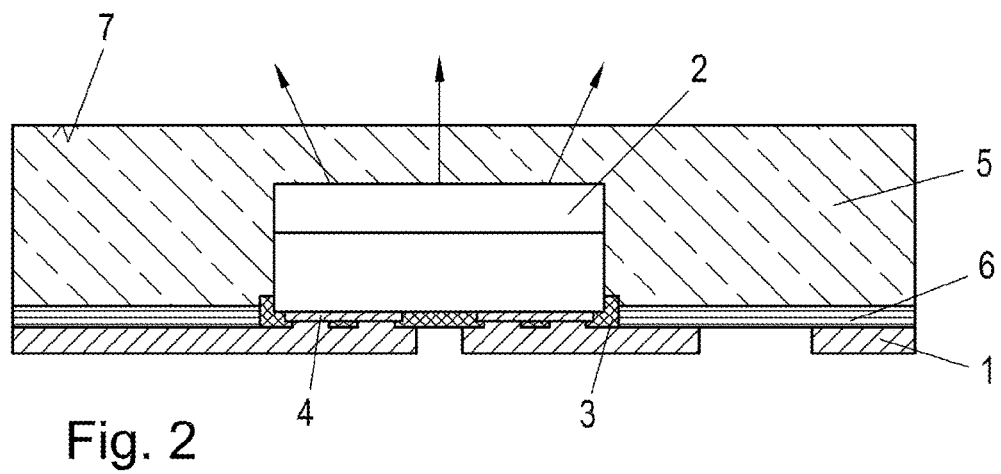
FIG. 2 shows a variant of the present invention, in which a light-reflecting layer is applied to the electrically conductive layer

In the variant of the present invention depicted in FIG. 2 a light-reflecting layer 6 is applied to the conductive layer 1, which serves to reflect light that is scattered from the boundary layer 7 of the transparent foil 2 back again thereby increasing the light-yield of the inventive product. The light-reflecting layer 6 can be white solder resist lacquer or a ceramic as in conformity with a preferred embodiment of the present invention.

Figure 3:
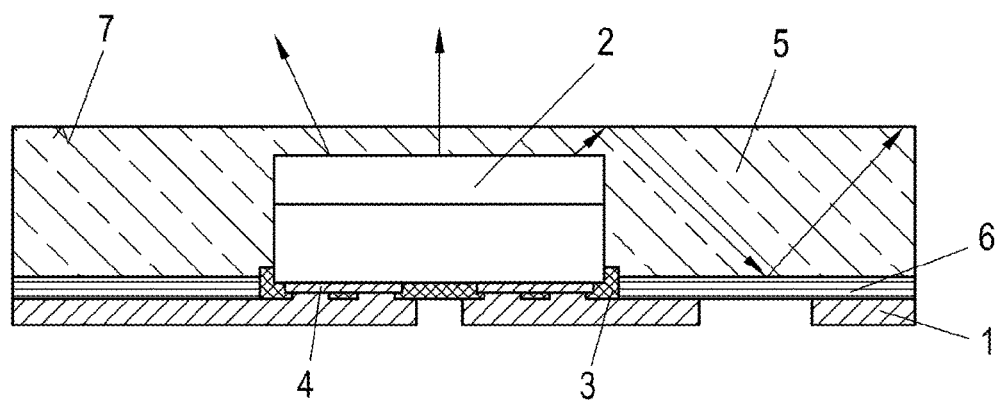
FIG. 3 shows a variant of the present invention, in which the transparent foil is structured to relief-like surface-structures

FIG. 3 shows a preferred embodiment in which the transparent foil 5 is structured to relief-like structures schematically depicted by the jagged outline of the transparent foil 5. The relief-like structures alter the optical properties of the transparent foil 5 and the inventive module and can be designed accordingly.

Figure 4:
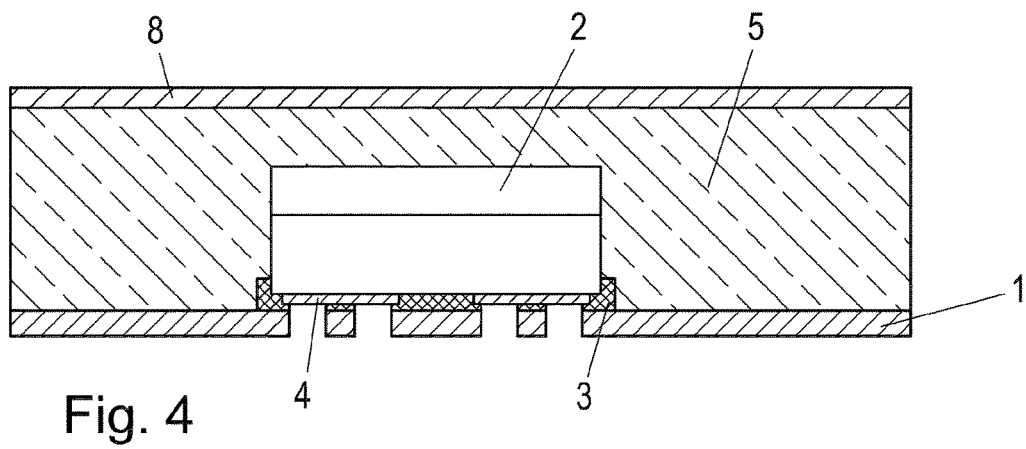
FIG. 4 shows a protective layer applied to the inventive electronic module of FIG. 2
Figure 5A:
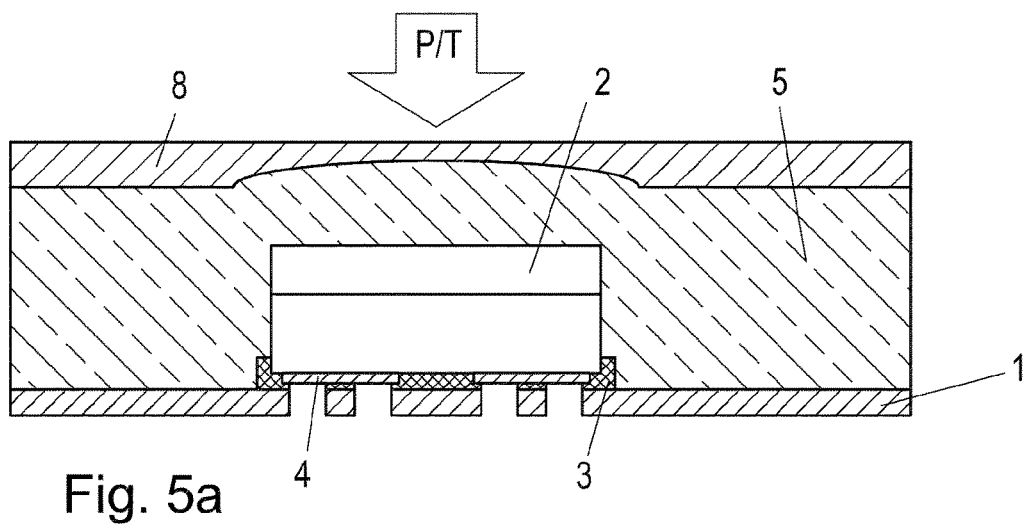
FIGS. 5a)-5b) show process steps to structure the transparent foil to relief-like surface-structures
Figure 5B:
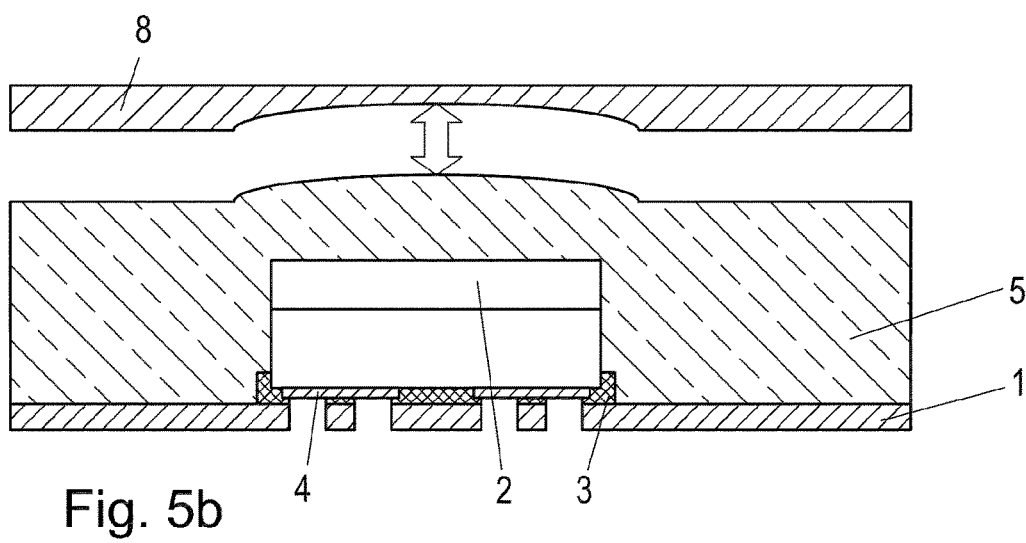

In FIG. 4, the transparent foil 5 is covered with a protective layer 8, which can take the form of a plastic foil, a protective lacquer and a metal foil. The protective layer 8 can be removed after possibly damaging process steps, for example copper plating and etching procedures in photolithography leaving the transparent foil 5 completely unharmed. According to the variant of FIG. 5a), the protective layer 8 is structured for engraving relief-like surface-structures into the transparent foil, which structures are revealed upon removal of the protective layer 8 (FIG. 5b)). In this particular example, the relief-like structures take the form of a lens 9 arranged above the light-emitting component 2.

Figure 6:
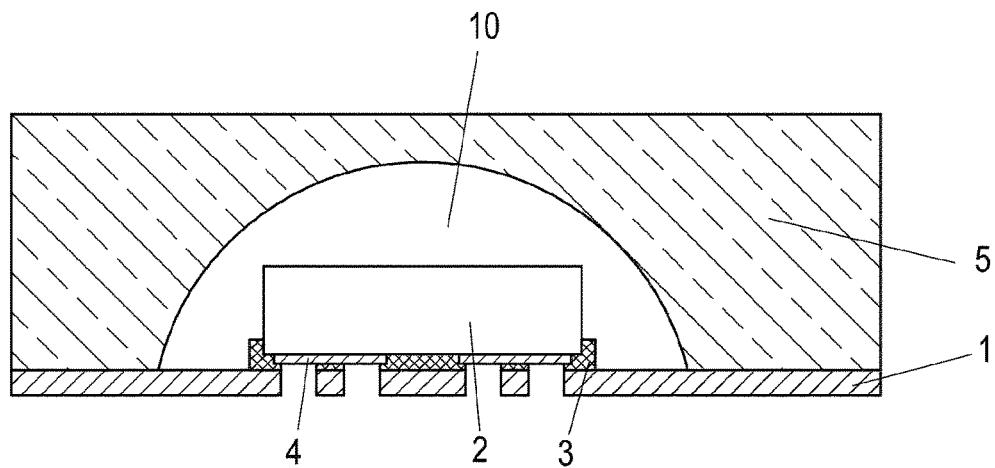
FIG. 6 shows a variant of the invention in which the light-emitting component is covered with a globe top and FIG. 7 shows a variant of the invention in which the light-emitting component is packaged.

In the example of FIG. 6, the light-emitting component 2 is covered by a so-called globe top 10, which serves to modulate the wavelength of the light emitted by the light-emitting component 2. As can be seen in this example, the globe top also can easily be embedded in the transparent foil 5.

Figure 7:
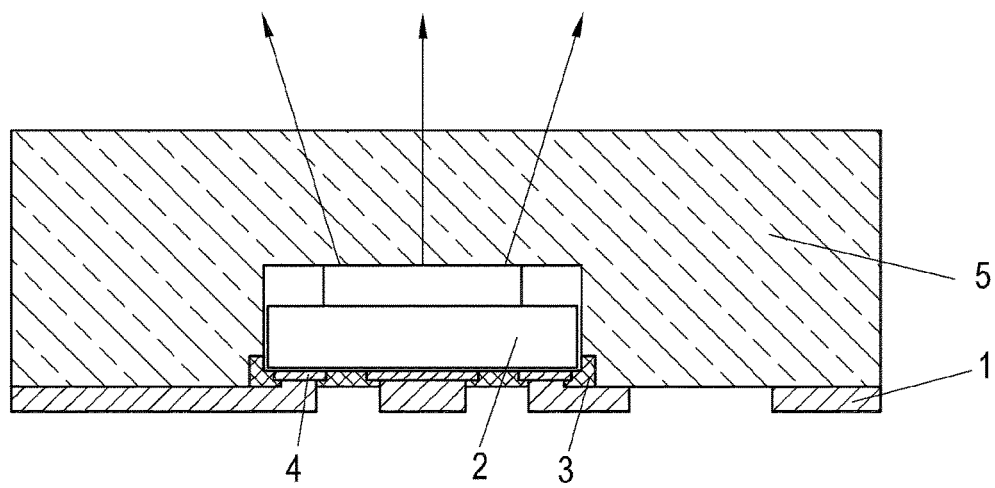

Alternatively, the light-emitting component 2 can be a packaged LED-chip (FIG. 7).

Although the present invention has been described in certain specific aspects, many additional modifications and variations would be apparent to those skilled in the art. It is therefore to be understood that the present invention may be practiced otherwise than specifically described, including various changes in the implementation such as utilizing encoders and decoders that support features beyond those specified within a particular standard with which they comply, without departing from the scope and spirit of the present invention. Thus, embodiments of the present invention should be considered in all respects as illustrative and not restrictive.

What is claimed is:

1. A method for the production of an electronic module characterized by the following steps:
    a) providing an electrically conductive layer;
    b) affixing at least one electronic component to the electrically conductive layer through a sticky electrically insulating layer disposed thereon;
    c) embedding the at least one electronic component in a transparent foil; and
    d) selectively electrically contacting the at least one electronic component previously embedded in the transparent foil with the electrically conductive layer.

2. A method according to claim 1, characterized in that the at least one electronic component is chosen from a group consisting of a light-emitting diode (LED), a laser-diode, a photo-diode and a photographic sensor.

3. A method according to claim 1, characterized in that the at least one electronic component is a LED-flipchip-component.

4. A method according to claim 1, characterized in that the step of contacting the at least one electronic component comprises a step of laser-drilling the conductive layer and the sticky electrically insulating layer.

5. A method according to claim 1, characterized in that prior to the step of affixing the light-emitting component on the electrically conductive layer, a light-reflecting layer is applied to the electrically conductive layer.

6. A method according to claim 5, characterized in that the light-reflecting layer is formed by a material chosen from the group consisting of solder resist and ceramic paste.

7. A method according to claim 5, characterized in that the light-reflecting layer is formed by a layer chosen from the group consisting of a metal layer and an oxide layer.

8. A method according to claim 1, characterized in that the transparent foil is an ethylene-vinyl acetate-foil.

9. A method according to claim 1, characterized in that embedding the at least one electronic component comprises laminating the transparent foil by means of a vacuum-lamination method at a suction pressure of 1 bar to 5 bar at a temperature of 130° C.

10. A method according to claim 1, characterized in that the transparent foil is covered with a protective layer chosen from the group consisting of a plastic foil, a protective lacquer and a metal foil.

11. A method according to claim 10, characterized in that the protective layer is structured for engraving relief-like surface-structures into the transparent foil.

12. A method according to claim 10, characterized in that the protective layer is applied together with the transparent foil.

13. A method according to claim 1, characterized in that the transparent foil is covered with a protective layer in form of a glass-plate.

14. A method according to claim 1, characterized in that the transparent foil is chemically roughened.

15. A method according to claim 1, characterized in that the sticky electrically insulating layer is selected from the group consisting of glue and sticky tape.

\* \* \* \* \*